(12) United States Patent
Moon et al.

(10) Patent No.: US 8,878,240 B2
(45) Date of Patent: Nov. 4, 2014

(54) VARIABLE RESISTANCE MEMORY DEVICE AND METHOD FOR FABRICATING THE SAME

(75) Inventors: Ji-Won Moon, Gyeonggi-do (KR); Sung-Hoon Lee, Gyeonggi-do (KR); Sook-Joo Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 75 days.

(21) Appl. No.: 13/619,918

(22) Filed: Sep. 14, 2012

(65) Prior Publication Data
US 2013/0299763 A1    Nov. 14, 2013

(30) Foreign Application Priority Data

May 11, 2012   (KR) .......................... 10-2012-0050366

(51) Int. Cl.
*H01L 45/00*  (2006.01)

(52) U.S. Cl.
USPC ......... 257/148; 257/1; 257/E45.002; 438/382

(58) Field of Classification Search
USPC .......................................................... 257/148
See application file for complete search history.

(56) References Cited

U.S. PATENT DOCUMENTS

| 2008/0293196 | A1 | 11/2008 | Rinerson et al. | |
| 2011/0248236 | A1* | 10/2011 | Kim et al. | 257/4 |
| 2012/0099367 | A1* | 4/2012 | Azuma et al. | 365/148 |
| 2012/0178210 | A1* | 7/2012 | Lee et al. | 438/104 |

* cited by examiner

*Primary Examiner* — Zandra Smith
*Assistant Examiner* — Lawrence Tynes, Jr.
(74) *Attorney, Agent, or Firm* — IP & T Group LLP

(57) ABSTRACT

A variable resistance memory device that includes a first electrode, a second electrode, a variable resistance layer interposed between the first electrode and a second electrode. A metal oxide electrode is interposed between the first electrode and the variable resistance layer, and the metal oxide electrode does not include a nitrogen constituent.

16 Claims, 4 Drawing Sheets

VARIABLE RESISTANCE MEMORY DEVICE AND METHOD FOR FABRICATING THE SAME

CROSS-REFERENCE TO RELATED APPLICATIONS

The present application claims priority of Korean Patent Application No. 10-2012-0050366, filed on May 11, 2012, which is incorporated herein by reference in its entirety.

BACKGROUND

Exemplary embodiments of the present invention relate to a variable resistance memory device and a method for fabricating the same, and more particularly, to a variable resistance memory device that includes a variable resistance layer capable of being changed in the electrical resistance thereof by migration of ions and vacancies and a method for fabricating the same.

DESCRIPTION OF THE RELATED ART

A variable resistance memory device refers to a device that stores data based on a characteristic that resistance changes based on an external stimulus and that switching is implemented between two different resistance states. An exemplary variable resistance memory device includes a ReRAM (resistive random access memory), a PCRAM (phase change RAM), and an STT-RAM (spin transfer torque-RAM). The variable resistance memory device has been actively researched since it can be formed in a simple structure and has various excellent properties, such as nonvolatility.

Among variable resistance memory devices, the ReRAM has a structure that includes a variable resistance layer formed of a variable resistance substance, for example, a perovskite-based substance or a transition metal oxide, and electrodes formed over and under the variable resistance layer. When a voltage is applied to an electrode, filament-type current paths are created or eliminated in the variable resistance layer. The variable resistance layer has a low resistance state when the filament-type current paths are created and has a high resistance state when the filament-type current paths are eliminated. Switching from the high resistance state to the low resistance state is referred to as a set operation, and conversely, switching from the low resistance state to the high resistance state is referred to as a reset operation.

FIGS. 1A to 1C are cross-sectional views showing a conventional variable resistance memory device and a method for fabricating the same.

Referring to FIG. 1A, a bottom electrode 20 is formed on a semiconductor substrate 10. The bottom electrode 20 may be formed by depositing a metal nitride, such as a titanium nitride (TIN), which is easy to etch.

Referring to FIG. 1B, a variable resistance layer 40 is formed on the bottom electrode 20. The variable resistance layer 40 may be deposited or grown using a reaction gas including ozone ($O_3$) or oxygen ($O_2$). In this process, as the surface of the bottom electrode 20, formed of the metal nitride, is oxidized, a metal oxynitride layer 30 is formed.

Referring to FIG. 1C, a top electrode 50 is formed on the variable resistance layer 40. Like the bottom electrode 20, the top electrode 50 may be formed by depositing a metal nitride, such as a titanium nitride (TiN).

However, in the conventional art, since the metal oxynitride layer 30 has a small band gap, current leakage is likely to occur. Furthermore, the metal oxynitride layer 30 may serve as a trap site for oxygen vacancies that form a current path in the variable resistance layer 40. Due to this fact, reset current increases and a non-uniform switching operation results. Therefore, measures to solve these problems are demanded in the art.

SUMMARY

Embodiments of the present invention are directed to a resistance variable memory device in which a metal electrode not including a nitrogen constituent is formed on an electrode formed of a metal nitride so as to prevent a metal oxynitride with poor characteristics from being generated while forming a resistance variable layer, thereby improving a switching characteristic, and a method for fabricating the same.

In accordance with an embodiment of the present invention, a variable resistance memory device may include a first electrode, a second electrode, a variable resistance layer interposed between the first electrode and the second electrode, and a metal oxide electrode interposed between the first electrode and the variable resistance layer, the metal oxide electrode not including a nitrogen constituent.

In accordance with another embodiment of the present invention, a variable resistance memory device may include a plurality of first lines disposed parallel to one another, a plurality of second lines disposed parallel to one another and crossing the first lines, and memory cells disposed at crossing points of the first lines and the second lines, each memory cell including: a variable resistance layer that may be switched between at least two difference resistance states, where a resistance of the variable resistance layer may be changed based on a voltage or current applied thereto , and a metal oxide electrode formed on the variable resistance layer, the metal oxide electrode not including a nitrogen constituent.

In accordance with yet another embodiment of the present invention, a method for fabricating a variable resistance memory device, the method may include forming a first electrode over a substrate; forming, over the first electrode, a metal electrode that does not include a nitrogen constituent, forming a variable resistance layer over the metal electrode, and forming a second electrode over the variable resistance layer, where in the forming of the variable resistance layer, the metal electrode is oxidized and is converted into a metal oxide electrode.

Thanks to the above embodiments, a metal electrode not including a nitrogen constituent is formed on an electrode formed of a metal nitride so as to prevent a metal oxynitride with poor characteristics from being generated while forming a resistance variable layer, whereby the switching characteristic of a resistance variable memory device may be improved.

DETAILED DESCRIPTION

Figure 1A:
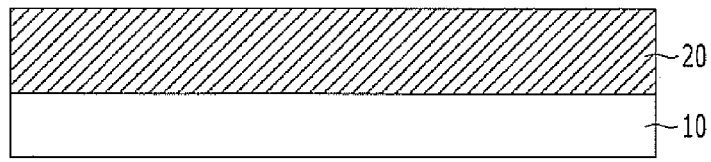
FIGS. 1A to 1C are cross-sectional views showing a conventional variable resistance memory device and a method for fabricating the same.
Figure 1B:
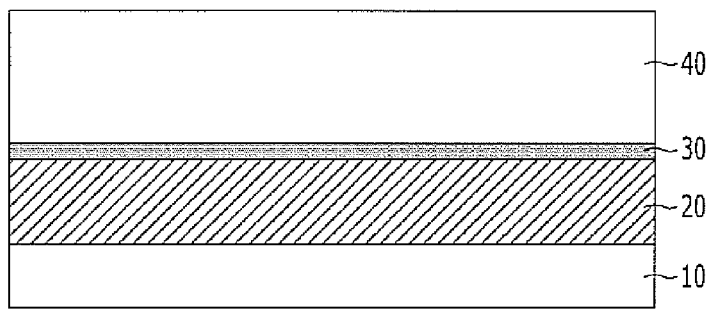
Figure 1C:
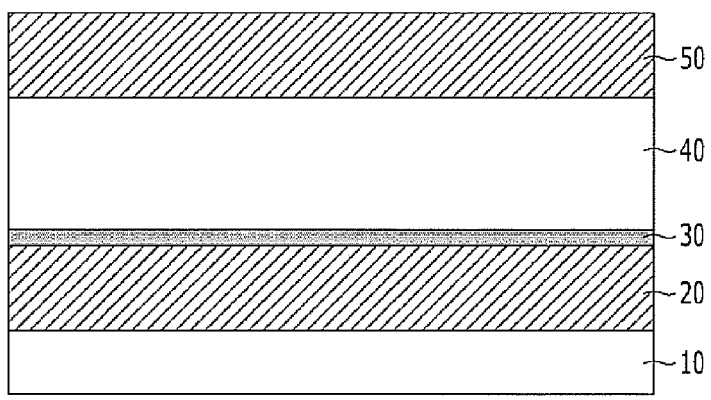

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 2A:
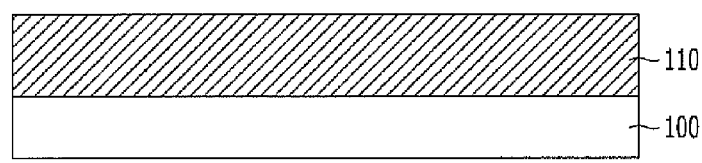
FIGS. 2A to 2D are cross-sectional views explaining a variable resistance memory device and a method for fabricating the same, in accordance with a first embodiment of the present invention.
Figure 2B:
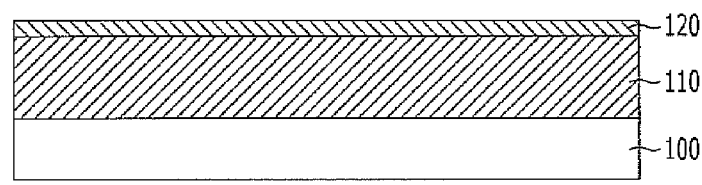
Figure 2C:
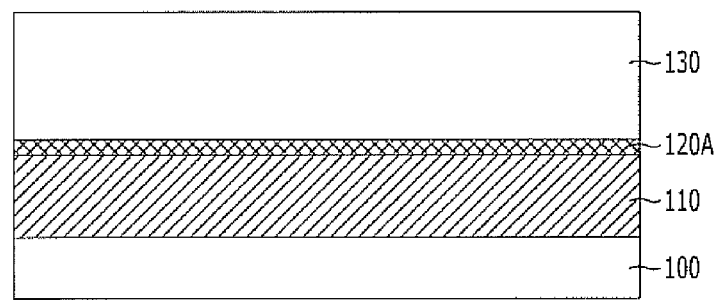
Figure 2D:
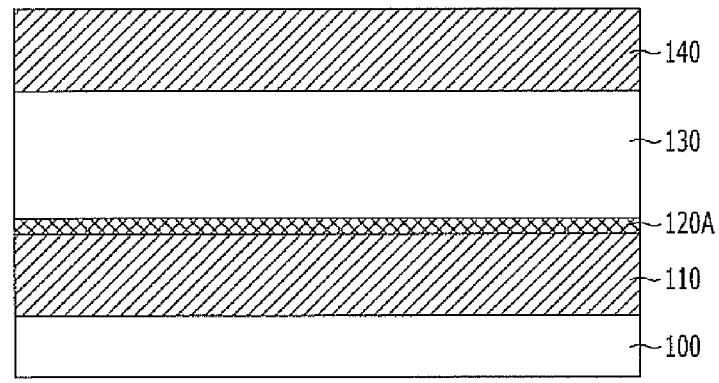

FIGS. 2A to 2D are cross-sectional views explaining a variable resistance memory device and a method for fabricating the same, in accordance with a first embodiment of the present invention. In particular, FIG. 2D is a cross-sectional view showing the variable resistance memory device in accordance with the first embodiment of the present invention, and FIGS. 2A to 2C are cross-sectional views showing the processes for fabricating the variable resistance memory device of FIG. 2D.

Referring to FIG. 2A, a first electrode 110 is formed on a substrate 100 with a predetermined underlying structure (not shown).

The first electrode 110 may be formed by depositing a metal nitride, such as a titanium nitride (TiN), a tantalum nitride (TaN), a tungsten nitride (WN), a titanium aluminum nitride (TiAlN), or a titanium silicon nitride (TiSiN). In particular, since such a metal nitride may be easily etched when compared to a noble metal such as platinum (Pt), it provides advantages in that patterning can be easily performed. The metal nitride may be deposited through, for example, physical vapor deposition (PVD). In the meantime, while not shown in the drawing, the substrate 100 may include a peripheral circuit for driving the variable resistance memory device.

Referring to FIG. 2B, a metal electrode 120, not including a nitrogen constituent, is formed on the first electrode 110.

The metal electrode 120 may include a metal that can be oxidized in a subsequent process while having a high work function. For example, the metal electrode 120 may be formed through sputtering by using at least any one of ruthenium (Ru), iridium (Ir), tantalum (Ta), or tungsten (W), as a target. In particular, the metal electrode 120 functions to prevent the first electrode 110, formed of the metal nitride, from being oxidized while forming a variable resistance layer as will be described below. As a consequence, it is possible to prevent a metal oxynitride, which is likely to deteriorate in switching characteristic, from being formed on the surface of the first electrode 110.

Referring to FIG. 2C, a variable resistance layer 130 is formed on the metal electrode 120. The variable resistance layer 130 may include a substance that changes electrical resistance by migration of oxygen vacancies or ions.

Substances that change electrical resistance by migration of oxygen vacancies or ions may be a binary oxide including a transition metal oxide (TMO), such as a titanium oxide ($TiO_2$), a hafnium oxide ($HfO_2$), a zirconium oxide ($ZrO_2$), an aluminum oxide ($Al_2O_3$), a tantalum oxide ($Ta_2O_5$), a niobium oxide ($Nb_2O_5$), a lanthanum oxide ($La_2O_3$), a cobalt oxide ($Co_3O_4$), or a tungsten oxide ($WO_3$).

The variable resistance layer 130 may be deposited or grown using a reaction gas including, for example, at least any one of ozone ($O_3$) or oxygen ($O_2$). In this process, as the metal electrode 120 is oxidized, the metal electrode 120 is converted into a metal oxide electrode 120A. The metal oxide electrode 120A has a work function equal to or greater than 3.0 eV, and may include, for example, a ruthenium oxide ($RuO_x$), an iridium oxide ($IrO_x$), a tantalum oxide ($TaO_x$) or a tungsten oxide ($WO_x$). In particular, because the metal oxide electrode 120A has a large band gap, leakage current is reduced, and because oxygen vacancies or ions may easily associate with, or dissociate from, the metal oxide electrode 120A, the uniformity of a switching operation may be improved. Moreover, since the overall resistance of a memory cell may be increased due to the presence of the metal oxide electrode 120A, reset current may be reduced. Thus, it is possible to prevent device characteristics from deteriorating due to repeated switching.

Referring to FIG. 2D, a second electrode 140 is formed on the variable resistance layer 130.

Like the first electrode 110, the second electrode 140 may be formed by depositing, by, for example PVD, a metal nitride, such as a titanium nitride (TiN), a tantalum nitride (TaN), a tungsten nitride (WN), a titanium aluminum nitride (TiAlN), or a titanium silicon nitride (TiSiN).

By using the fabrication method described above, the variable resistance memory device in accordance with the first embodiment of the present invention as shown in FIG. 2D may be fabricated.

Referring to FIG. 2D, the variable resistance memory device, in accordance with the first embodiment of the present invention, may include the first electrode 110, the second electrode 140, the variable resistance layer 130 interposed between the first electrode 110 and the second electrode 140, and the metal oxide electrode 120A interposed between the first electrode 110 and the variable resistance layer 130 and not including a nitrogen constituent.

The metal oxide electrode 120A may have a work function equal to or greater than 3.0 eV, and may include at least any one of a ruthenium oxide ($RuO_x$), an iridium oxide ($IrO_x$), a tantalum oxide ($TaO_x$), or a tungsten oxide ($WO_x$).

Each of the first and second electrodes 110 and 140 may include a metal nitride, and the variable resistance layer 130 may include a substance of which electrical resistance changes by migration of oxygen vacancies or ions.

Figure 3A:
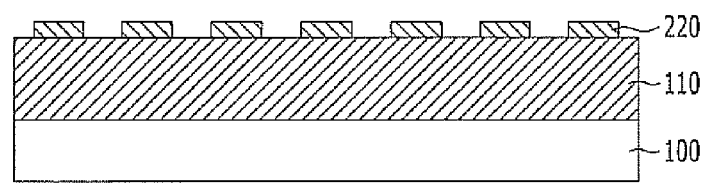
FIGS. 3A to 3C are cross-sectional views explaining a variable resistance memory device and a method for fabricating the same, in accordance with a second embodiment of the present invention.
Figure 3B:
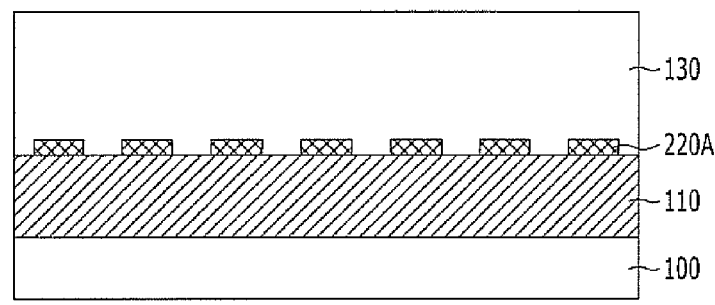
Figure 3C:
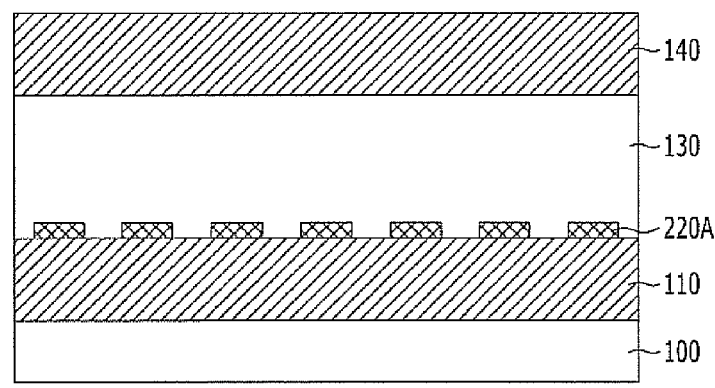

FIGS. 3A to 3C are cross-sectional views explaining a variable resistance memory device and a method for fabricating the same, in accordance with a second embodiment of the present invention. In describing the present embodiment, detailed descriptions for substantially the same component parts as in the aforementioned first embodiment will be omitted. After the process of FIG. 2A is performed in the same manner as the first embodiment, the process of FIG. 3A is performed.

Referring to FIG. 3A, metal electrodes 220, not including a nitrogen constituent, are formed on a first electrode 110 to have island-like shapes.

The metal electrodes 220 may include a metal that can be oxidized while having a high work function. For example, the metal electrodes 120 may be formed of at least any one of ruthenium (Ru), iridium (Ir), tantalum (Ta), or tungsten (W). In particular, in the case where such a metal is deposited so that homogeneous nucleation occurs in a vapor phase and heterogeneous nucleation occurs on the surface of the first electrode 110, primary growth occurs as the nucleus of the metal is produced in a vapor phase, and secondary growth occurs on the surface of the first electrode 110. Through this, the metal electrodes 220 may be formed not as a continuous surface but as island-like shapes. In this case, since filament-type current paths are not dispersed and are concentrated on sites where the metal electrodes 220 are formed, a resistive switching characteristic may be easily controlled.

In the variable resistance memory device having a plurality of memory cells, as the metal electrodes 220 are uniformly distributed to the respective memory cells, a uniform switching characteristic may be achieved. In detail, as the set voltages/current and the reset voltages/current of the respective memory cells are constantly maintained, the reliability of the variable resistance memory device may be improved.

Referring to FIG. 3B, a variable resistance layer 130 is formed on the first electrode 110 on which the metal electrode 220 is formed. The variable resistance layer 130 may include a substance that changes electrical resistance by migration of oxygen vacancies or ions, for example, a binary oxide, such as a transition metal oxide (TMO).

The variable resistance layer 130 may be deposited or grown using a reaction gas including, for example, at least any one of ozone ($O_3$) and oxygen ($O_2$). In this process, as the metal electrodes 220 are oxidized, the metal electrodes 220 are converted into metal oxide electrodes 220A. The metal oxide electrode 120A has a work function equal to or greater than 3.0 eV, and may include, for example, a ruthenium oxide ($RuO_x$), an iridium oxide ($IrO_x$), a tantalum oxide ($TaO_x$), or a tungsten oxide ($WO_x$).

Referring to FIG. 3C, a second electrode 140 is formed on the variable resistance layer 130.

Like the first electrode 110, the second electrode 140 may be formed by depositing, by, for example, PVD, a metal nitride, such as a titanium nitride (TiN), a tantalum nitride (TaN), a tungsten nitride (WN), a titanium aluminum nitride (TiAlN), or a titanium silicon nitride (TiSiN).

The second embodiment described just above is different from the first embodiment in that the metal oxide electrodes 220A are formed not as a continuous surface but as a plurality of island-like shapes.

Figure 4:
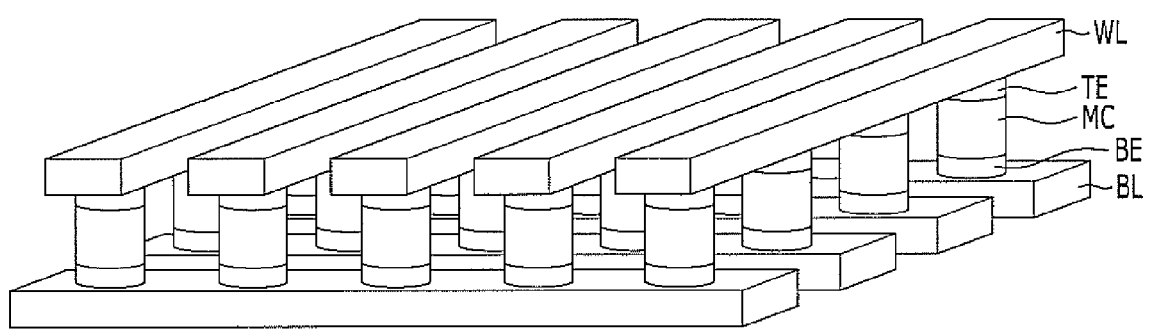
FIG. 4 is a perspective view showing a cross point cell array structure.

FIG. 4 is a perspective view showing a cross point cell array structure.

Referring to FIG. 4, the variable resistance memory device, in accordance with the embodiments of the present invention, may be formed to have a cross point cell array structure. The cross point cell array structure refers to a structure in which memory cells MC are disposed at crossing points between a plurality of first lines BL disposed parallel to one another and a plurality of second lines WL, disposed parallel to one another, and crossing with the first lines BL, and selection elements (not shown). The selection elements may include, for example, transistors or diodes and may be connected to the top parts or bottom parts of the respective memory cells MC.

The memory cells MC may include a variable resistance layer in which resistance changes according to an applied voltage or current to allow the variable resistance layer to be switched between at least two resistance states, and may include a metal oxide electrode that contacts the variable resistance layer and does not include a nitrogen constituent. The bottom parts of the memory cells MC may be connected with the first lines BL through first electrodes BE, and the top parts of the memory cells MC may be connected with the second lines WL through second electrodes TE.

As is apparent from the above descriptions, in the variable resistance memory device, and the method for fabricating the same, according to the embodiments of the present invention, since a metal electrode, not including a nitrogen constituent, is formed on an electrode formed of a metal nitride, it is possible to prevent a metal oxynitride having poor characteristics from being generated while forming a variable resistance layer. In particular, due to the presence of a metal oxide electrode, which is formed through oxidation of the metal electrode not including a nitrogen constituent, the leakage current of a memory cell may be reduced and the overall resistance of the memory cell may be increased. As a consequence, the switching characteristic of the variable resistance memory device may be improved.

While the present invention has been described with respect to the specific embodiments, it will be apparent to those skilled in the art that various changes and modifications may be made without departing from the spirit and scope of the invention as defined in the following claims.

What is claimed is:

1. A variable resistance memory device comprising:
   a first electrode;
   a second electrode;
   a variable resistance layer interposed between the first electrode and the second electrode; and
   a metal oxide electrode interposed between the first electrode and the variable resistance layer, the metal oxide electrode not including a nitrogen constituent,
   wherein the metal oxide electrode is formed into a plurality of island-like shapes over the first electrode.

2. The variable resistance memory device according to claim 1, wherein the metal oxide electrode comprises at least any one of a ruthenium oxide, an iridium oxide, a tantalum oxide, or a tungsten oxide.

3. The variable resistance memory device according to claim 1, wherein the metal oxide electrode has a work function equal to or greater than 3.0 eV.

4. The variable resistance memory device according to claim 1, wherein the first or second electrode comprises a metal nitride.

5. The variable resistance memory device according to claim 1, wherein the variable resistance layer comprises a substance that changes electrical resistance by migration of oxygen vacancies or ions.

6. A variable resistance memory device comprising:
   a plurality of first lines disposed parallel to one another;
   a plurality of second lines disposed parallel to one another and crossing the first lines; and
   memory cells disposed at crossing points of the first lines and the second lines, each memory cell comprising:
      a variable resistance layer that may be switched between at least two different resistance states, where a resistance of the variable resistance layer may be changed based on a voltage or current applied thereto, and
      a metal oxide electrode formed on the variable resistance layer, the metal oxide electrode not including a nitrogen constituent,
   wherein the metal oxide electrode is formed into a plurality of island-like shapes over the variable resistance layer.

7. The variable resistance memory device according to claim 6, wherein the metal oxide electrode comprises at least any one selected from the group consisting of a ruthenium oxide, an iridium oxide, a tantalum oxide and a tungsten oxide.

8. The variable resistance memory device according to claim 6, wherein the metal oxide electrode has a work function equal to or greater than 3.0 eV.

9. The variable resistance memory device according to claim 6, wherein the variable resistance layer comprises a substance that changes electrical resistance by migration of oxygen vacancies or ions.

10. The variable resistance memory device according to claim 6, further comprising:
 first electrodes interposed between the first lines and the memory cells; and
 second electrodes interposed between the second lines and the memory cells.

11. The variable resistance memory device according to claim 10, wherein the first or second electrodes comprise a metal nitride.

12. A method for fabricating a variable resistance memory device, the method comprising:
 forming a first electrode over a substrate;
 forming, over the first electrode, a metal electrode that does not include a nitrogen constituent;
 forming a variable resistance layer over the metal electrode; and
 forming a second electrode over the variable resistance layer,
 wherein in the forming of the variable resistance layer, the metal electrode is oxidized and is converted into a metal oxide electrode,
 wherein the metal electrode is formed into a plurality of island-like shapes over the first electrode.

13. The method according to claim 12, wherein the metal electrode is formed of at least any one selected from the group consisting of ruthenium, iridium, tantalum and tungsten.

14. The method according to claim 12, wherein the metal oxide electrode has a work function equal to or greater than 3.0 eV.

15. The method according to claim 12, wherein the first or second electrode is formed of a metal nitride.

16. The method according to claim 12, wherein the variable resistance layer is formed through deposition or growth using at least one reaction gas of ozone or oxygen.

* * * * *